United States Patent [19]
Aalaei

[11] Patent Number: 4,905,255
[45] Date of Patent: Feb. 27, 1990

[54] DECISION DIRECTED GAIN CONTROL

[75] Inventor: Farajollah Aalaei, Hudson, N.H.

[73] Assignees: American Telephone and Telegraph Company, New York, N.Y.; AT&T Bell Laboratories, Murray Hill, N.J.

[21] Appl. No.: 293,027

[22] Filed: Jan. 3, 1989

[51] Int. Cl.⁴ .............................................. H04L 25/06
[52] U.S. Cl. ........................................ 375/17; 307/359; 341/156; 341/200; 375/76
[58] Field of Search ............................ 375/76, 17, 98; 341/156, 200, 170; 307/359; 328/162, 164

[56] References Cited
U.S. PATENT DOCUMENTS 4,250,458  2/1981  Richmond et al. .................. 375/76
4,553,102  11/1985  Yoshida .............................. 375/76
4,602,374  7/1986  Nakamura et al. .................. 375/76

Primary Examiner—Robert L. Griffin
Assistant Examiner—Marlanne Huseman
Attorney, Agent, or Firm—Joseph A. Cameron

[57] ABSTRACT

In a receiver for receiving and decoding a baseband multilevel signal into a digital data signal, and A/D converter produces in addition to the decoded data bits a "soft" bit, which inherently indicates the error polarity of the baseband signal. The soft bits are binary added to the most significant data bits to produce a sum bit. The sum bits are integrated, and the integral is used in a feedback loop to control the baseband signal amplitiude.

1 Claim, 2 Drawing Sheets

A/D CONVERSION 8 LEVEL

DECISION DIRECTED GAIN CONTROL

TECHNICAL FIELD

This invention is in the field of digital communications; more particularly, it relates to receiving equipment for recovering a binary data signal from a transmitted multilevel signal.

BACKGROUND OF THE INVENTION

In digital transmission systems, of both the land line and radiated wave varieties, the data payload is commonly transmitted in the form of a multilevel analog signal to improve the data transmission rate. In such systems each possible amplitude level represents a unique combination of data bits. Since there are $2^n$ unique combinations of n bits, $2^n$ amplitude levels are required to transmit n bits per baud. That bit rate can be doubled by quadrature amplitude modulating a high carrier frequency by each of two multilevel signals. A 16 QAM signal, therefore, uses four amplitude levels to transmit two data bits on each of two "rails" for a total of four data bits per baud.

Needless to say, the desire for higher and higher data transmission rates is driving the need for more amplitude levels; more levels, however, bring more complications. At the receiver or regenerator, a decoder must be able to accurately determine the transmitted levels in spite of any distortion or interference in order to recover the data. This can become very difficult, for example, in a 256 QAM system where sixteen discreet levels must be accurately discerned, to recover eight bits per baud.

In radio transmission systems, where continually changing atmospheric conditions cause varying amounts of signal fading, accurate quantizing or "slicing" of the multilevel signal is particularly difficult.

The traditional apparatus used to compensate for radio signal fading is the automatic gain control (AGC) circuit. A typical AGC circuit determines the amplitude of the envelope signal at radio frequency (RF) or intermediate frequency (IF) and compares it with a predetermined reference voltage to generate a difference signal, which drives an amplifier in a feedback circuit. Unfortunately, such AGC circuits are not nearly accurate enough for very high bit rate digital radio systems.

One known system for improving the quantizing accuracy in a digial radio receiver is disclosed in U.S. Pat. No. 4,326,169 entitled "Adaptive Decision Level Circuit", which issued to Fenderson et al. Apr. 20, 1982. According to the Fenderson scheme, the decision levels are shifted to compensate for shifts in signal levels. An error signal is generated by comparing the integrated difference between the binary output of a level slicer and its complement with the statistically expected difference. Feedback circuitry shifts the decision level to minimize the difference between the measured and expected values.

While the Fenderson scheme is very useful for radio systems in which up to eight amplitude levels are transmitted, e.g., 64 QAM, it does not provide enough improvement for reliable operation at sixteen amplitude levels.

An object of my invention is a much more accurate multilevel signal amplitude. used with fixed decision levels, it can enable accurate decoding of 16 amplitude levels in a 256 QAM digital radio system.

SUMMARY OF THE INVENTION

A receiver for receiving and decoding a baseband multilevel signal into a digital data signal comprises quantizing means for quantizing the received multilevel signal at specified sampling times into discrete amplitude ranges and producing in response to each amplitude range a unique combination of data bits to form the data signal and a soft bit indicative of whether the multilevel signal is more or less positive than the center of a discrete amplitude range, and feedback means responsive to the soft bits for varying the baseband multilevel signal amplitude to center the multilevel signal in the amplitude ranges.

DETAILED DESCRIPTION

Figure 1:
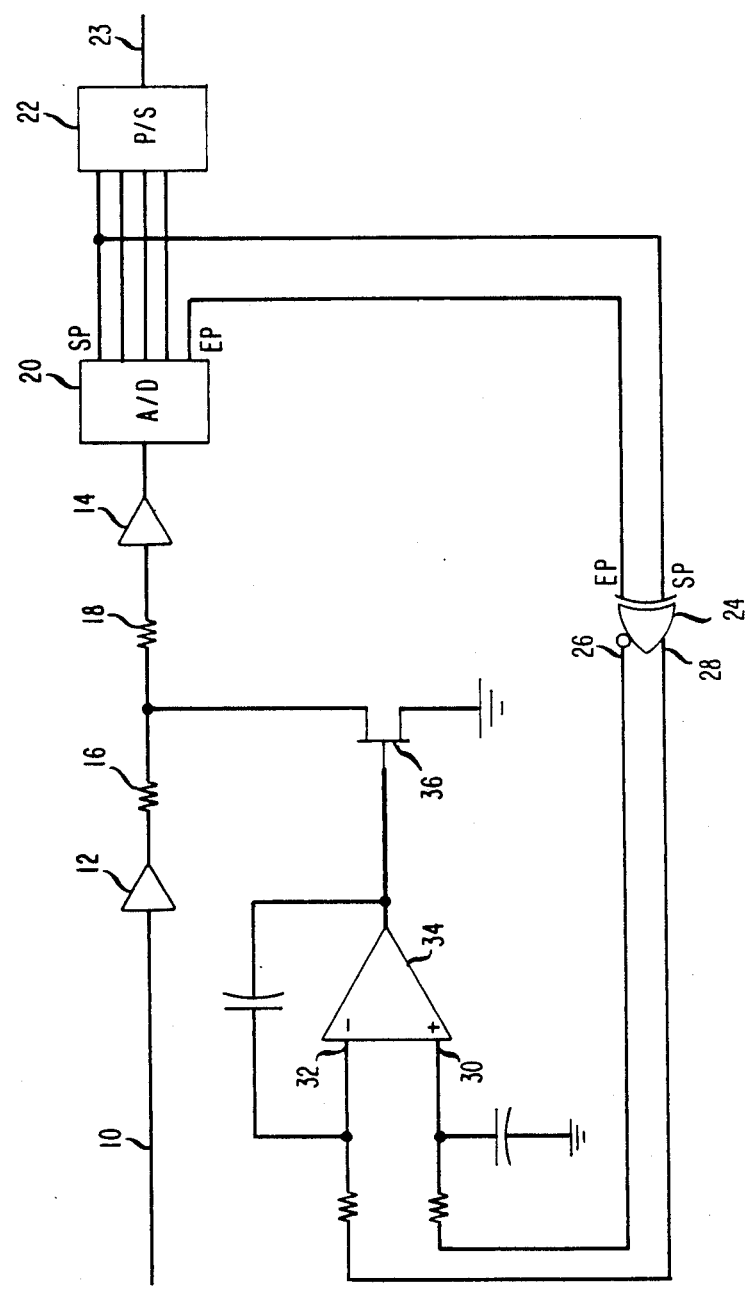
FIG. 1 is a partly block-partly schematic diagram of an embodiment of the invention.

A particularly useful embodiment of an invention that is inexpensive to produce and very effective is illustrated in the diagram of FIG. 1 to which reference is now made.

The multilevel signal after demodulation to baseband appears on input lead 10. A pair of amplifiers 12 and 14, separated by a series pair of resistors 16 and 18 may connect the baseband signal to an analog-to-digial (A/D) converter 20. A/D converter 20 has five parallel bit outputs, four of which are connected to a parallel-to-serial (P/S) converter 22, the output 23 of which may carry the decoded data bit stream. The most significant (SP) and least significant bit (EP) outputs of A/D converting 20 are connected to an EXCLUSIVE-OR gate 24. Inverting output 26 and non-inverting output 28 of gate 24 may be connected to non-inverting input 30 and inverting input 32, respectively, of a differential amplififer 34, and the output amplifier 34 may be connected to the gate of a field effect transistor 36, the drain-source path of which may be connected between the common junction of resistors 16 and 18 and ground.

Figure 2:
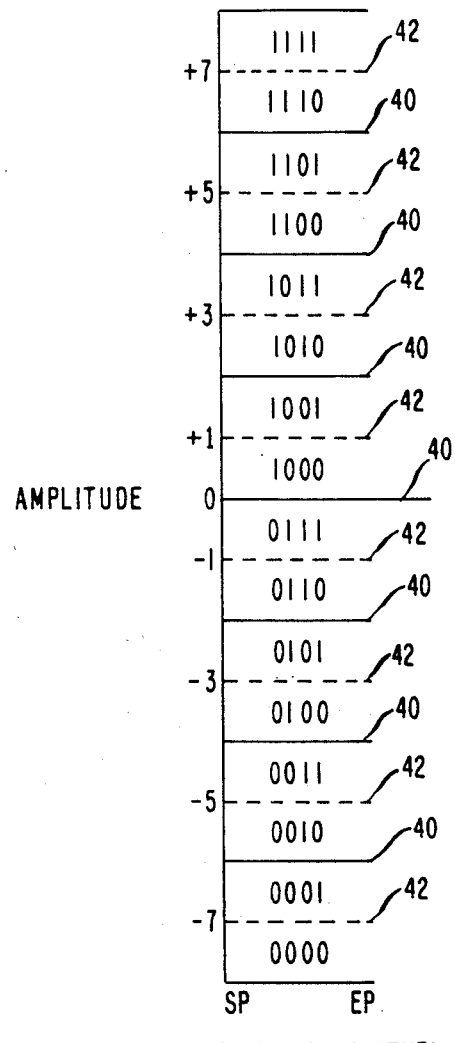
FIG. 2 is an analog-to-digial conversion table useful in explaining the operation of the embodiment of FIG. 1.

In order to understand the operation of the embodiment of FIG. 1, a discussion of FIG. 2 may be helpful. FIG. 2 is a table that illustrates the conversion of relative voltage amplitude, shown as ordinates, to data bits, shown as abscissas, in a standard binary four-bit A/D converter. It will be noted that the vertical scale is divided by seven solid lines 40 into eight ranges; the analog input signal may be converted into the three most significant bits associated with the range into which its amplitude falls at the prescribed sampling times. Solid lines 40 are therefore the slicing levels of the A/D converter. It will also be noted that each of the eight ranges is bisected by a dashed line 42, which indicates the exact amplitude represented by the respective 3 bits. The fourth bit, which in a four-bit converter is the least significant bit, is a "1" if the amplitude is above the dashed line and a "0" if it is below. When a four-bit converter, therefore, is used to decode an eight level signal, the fourth bit does not enter into the decoded data signal, and is termed a "soft" bit. Importantly, however, this soft bit indicates whether the analog multilevel signal amplitude is more positive or more negative than the exact amplitude represented by the three data bits. It therefore is accurate to call it an "error polarity" (EP) bit. Similarly, the most significant bit output by the A/D converter, since it is "1" for all positive amplitudes and "0" for all negative amplitudes is a "signal polarity" (SP) bit.

With a standard binary A/D converter, the EP bit, of course, does not by itself indicate whether the analog signal amplitude should be increased or decreased for optimum accuracy. When the analog signal is positive (SP is "1") and EP is "1", the amplitude should be decreased, but when SP is "0" and EP is "1" the amplitude should be increased. With sign-magnitude type coding, on the other hand, the soft bit out of the A/D converter always indicates whether the baseband signal amplification should be increased or decreased to improve accuracy.

Returning now to FIG. 1, A/D converter 20 produces five output bits on five respective outputs. The four most significant bits are put in serial order by P/S 22 to form the decoded data. A/D 20 may therefore decode the 16 level signal on one rail of a 256 QAM system, and produce in addition a soft EP bit to aid in implementing the invention.

Both SP and EP are therefore fed to EXCLUSIVE-OR gate 24. When EP and SP are both "1's" or both "0's" indicating the need for more amplitude, output 28 feeds "0's" to inverting input 32 of integrating amplifier 34, and inverting output 26 feeds "1's" to non-inverting input 30. The time integral output of amplifier 34 increases, raising the bias, on FET 36 to reduce the current shunted from amplifier 14. The result is an increase in amplitude of the analog multilevel signal into A/D 20 to reduce the slicing error. Similarly, when EP and SP are opposite, the integral output of amplifier 34 decreases, and the analog signal amplitude is decreased. With the addition of one more bit from the A/D converter than is needed to decode the multilevel signal, therefore, and a simple feedback circuit according to my invention, the multilevel signal amplitude can be made accurate enought to use fixed slicing levels and produce far more accuraet decoding than has heretofore been possible.

It will be obvious to those skilled in the art that other feedback arrangements than that shown in FIG. 1 can be used to implement the invention; for example, in the embodiment of FIG. 2, signal gain is controlled by the combination of amplifiers 12 and 14 and the feedback-controlled attenuator comprising resistors 16 and 18 and transistor 36. In another embodiment, a variable-gain amplifier could be driven directly by the output of integrator 34. Furthermore, in a system which uses sign-magnitude decoding, a "1" EP bit might represent the need for less gain with either polarity baseband signal voltage. In such a system, therefore, the EP bits could be time-averaged without regard to the SP bits, eliminating gate 24. Those skilled in the art will also recognize that the function of integrating, or time averaging the gain correction information can be performed digitally with an up-down counter.

Optimum bandwidth for the feedback loop, which in the embodiment of FIG. 2 is set largely by the input resistors and capacitors of integrator 34, should be only large enough to pass the signal fading rate, thereby eliminating unnecessary noise. Values of 1000 ohms and 1 microfarad, for example, are found to operate very satisfactorily.

I claim:

1. In a receiver having decoding means for decoding a baseband multilevel signal into a digital data signal,
   said decoding means comprising quantizing means for quantizing said multilevel signal into discrete amplitude ranges and producing in response to each discrete amplitude range a unique combination of bits including a plurality of data bits in descending order of significance to form said data signal and a less significant soft bit,
   an arrangement for automatically controlling the amplitude of said multilevel signal comprising:
   an EXCLUSIVE-OR gate connected to said quantizing means and having a first output for producing a modulo-two sum of said soft bit and said most significant bit and a second output for producing the complement of said sum;
   an integrating differential amplifier having an output, an inverting input connected to said first EXCLUSIVE-OR gate output and a non-inverting input connected to said second EXCLUSVIE-OR gate output;
   resistance means connected in series in the path of said multilevel signal; and
   a transistor having its gate electrode connected to the output of said differential amplifier and its source-drain path connected from a point on said multilevel signal path between said resistance means and said quantizing means to ground.

* * * * *